(12) United States Patent
McDaniel

(10) Patent No.: US 6,258,709 B1
(45) Date of Patent: Jul. 10, 2001

(54) FORMATION OF ELECTRICAL INTERCONNECT LINES BY SELECTIVE METAL ETCH

(75) Inventor: Terrence McDaniel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/589,903

(22) Filed: Jun. 7, 2000

(51) Int. Cl.[7] .............................................. H01L 21/4763
(52) U.S. Cl. ...................... 438/622; 438/629; 438/631; 438/669; 438/672
(58) Field of Search ..................................... 438/622, 629, 438/631, 669, 672

(56) References Cited

U.S. PATENT DOCUMENTS

| 5,854,140 | 12/1998 | Jaso et al. |
|---|---|---|
| 5,874,201 | 2/1999 | Licata et al. |
| 5,981,374 | 11/1999 | Dalal et al. |
| 5,989,623 | 11/1999 | Chen et al. |
| 6,004,874 | * 12/1999 | Cleeves ................................. 438/622 |
| 6,100,180 | * 8/2000 | Howard ................................. 438/626 |
| 6,107,188 | * 8/2000 | Liu et al. ............................. 438/633 |
| 6,153,510 | * 11/2000 | Ishibashi ............................. 438/622 |
| 6,165,895 | * 12/2000 | Lin ....................................... 438/633 |
| 6,187,672 | * 2/2001 | Zhao et al. ........................... 438/639 |

* cited by examiner

Primary Examiner—Trung Dang
(74) Attorney, Agent, or Firm—Killworth, Gottman, Hagan & Schaeff, L.L.P.

(57) ABSTRACT

A process for the formation of electrical interconnect lines by a selective metal etch to form electrical interconnections between different layers in a semiconductor device is provided. The process eliminates the need to form vias between conductive layers in the structure by etching through an oxide layer. The resulting structure provides superior electrical contacts between electrically conductive features on different layers of a semiconductor device. Additionally, the process produces self-aligned vias, thereby eliminating misalignment problems and the need to pattern surrounds onto the M1 layer in a semiconductor stack or any other lower level metal.

23 Claims, 8 Drawing Sheets

FORMATION OF ELECTRICAL INTERCONNECT LINES BY SELECTIVE METAL ETCH

BACKGROUND OF THE INVENTION

This invention relates to a metallization method in the manufacture of semiconductor devices, and more particularly to the formation of electrical interconnect lines by a selective metal etch to form electrical interconnections between different layers in a semiconductor device.

Integrated circuits are manufactured by an elaborate process in which a variety of different electronic devices are integrally formed on a small silicon wafer. Conventional electronic devices include capacitors, resistors, transistors, diodes, and the like. In advanced manufacturing of integrated circuits, hundreds of thousands of electronic devices are formed on a single wafer.

One of the steps in the manufacture of integrated circuits is to form metal interconnect lines between the discrete electronic devices on the integrated circuit. The metal interconnect lines allow for an electrical current to be delivered to and from the electronic devices so that the integrated circuit can perform its intended function.

The metal interconnect lines generally comprise narrow bands of aluminum, copper, or other conductive metal. Aluminum has typically been used because it has a relatively low resistivity, good current-carrying density, superior adhesion to silicon dioxide, and is available in high purity. Each of these properties is desirable in interconnect lines as they result in a faster and more efficient electronic circuit.

The computer industry is constantly under market demand to increase the speed at which integrated circuits operate and to decrease the size of integrated circuits. To accomplish this task, the electronic devices on a silicon wafer are continually being increased in number and decreased in dimension. In turn, the dimension of the metal interconnect lines must also be decreased. This process is known as miniaturization.

Metal interconnect lines are now believed to be one of the limiting factors in the miniaturization of integrated circuits. It has been found, however, that by using more than one level in the interconnect, the average interconnect link is reduced and with it the space required on the integrated circuit. Thus, integrated circuits can further be reduced in size. These multi-level metals are referred to as metal interconnect stacks, named for the multiple layers of different metals which are stacked on top of each other. The interconnection features are sometimes referred to as vias or contacts. Reliable formation of these interconnect features is very important to the successful production of semiconductor devices and to the continued effort to increase circuit density.

One known procedure for the fabrication of semiconductor devices is illustrated in FIGS. 1a–1d which, in cross-sectional schematic diagrams, illustrate a stacked-layer semiconductor structure 10 which includes a dielectric layer 12 formed over an underlying layer 14 which contains electrically conductive features 16. Alternatively, the entire underlying layer 14 may be electrically conductive and may comprise a metal or doped silicon layer. Dielectric layer 12 typically comprises an oxide such as silicon oxide and is formed in a manner which is conventional in the art. Typically, dielectric layer 12 is termed an interlayer dielectric (ILD) as its purpose is to isolate metal features in different layers in the stack. Generally, a metal or electrically conductive feature in the layer of the semiconductor structure immediately beneath the dielectric layer may be termed metal layer 1 or M1, and any metal or electrically conductive feature immediately above dielectric layer 12 may be termed metal layer 2 or M2.

As shown in FIG. 1b, once dielectric layer 12 has been deposited, it is etched using conventional photolithography masking and etching techniques to form vias or openings 18 which expose the surface of electrically conductive features 16. Referring now to FIG. 1c, via 18 is then filled with a conductive material such as a metal 20 to provide electrical contact with electrical feature 16. Metal 20 may be deposited by any conventional process. Typically, the upper surface of structure 10 is then planarized. Finally, as shown in FIG. 1d, one or more metal layers or other electrically conductive features 22 are provided, typically by photolithography masking and deposition techniques. For example, features 22 may be provided by patterning a photo mask and removing the patterned areas, followed by depositing the metal into the open areas in the pattern. Once the metal is deposited, the remainder of the photo mask material is removed.

However, this prior art technique suffers from a number of problems. One significant problem is that the etching process to remove portions of the dielectric layer 12 leaves behind polymeric debris and other contaminants in vias 18. Such materials are difficult to clean out completely and interfere with the subsequent metal deposition step and prevent making good electrical contacts between the M1 and M2 layers. Further, as the widths of vias 18 are quite small, the positioning of the patterning photo masks must be precise, as any misalignment may result in a missed connection or only partial alignment of the M1 and M2 features. To address this alignment problem, in some instances the metal features on the M1 level have had to be patterned to increase their apparent surface area by adding what are termed "surrounds." However, this adds additional processing steps and further complicates the fabrication of the devices and makes miniaturization more difficult.

Another known procedure for forming the electrical interconnect lines between layers is known as the "dual damascene" process, of which there are numerous variations. Generally, the dual damascene process uses two sequential photoresist and etch steps to form a first opening or via through an oxide layer to an underlying metal line. A second in-line opening is made to form a conductive line above the via. Thus, two photoresist and etch steps are used to form a combined via and line in the oxide layer. Any remaining materials, including contaminants and other debris resulting from the etch process, must be cleaned out of the resulting via. Both openings are then filled with a conductive metal such as aluminum or copper, typically using sputter deposition or CVD processes. In most instances, there is a need for the formation of seed layers or barrier layers for the conductive metal. After the conductive metal has been deposited, excess metal is removed by mechanical or chemical mechanical polishing of the surface to produce a planarized surface. However, such polishing steps also tend to remove some of the oxide layer as well.

Current methods used in this art, including the dual damascene method and its variations, have drawbacks in the formation of electrical interconnect lines including the need to etch through an oxide layer to form the vias (resulting in the need for contaminant removal and cleaning), misalignment of vias, and increasingly high aspect fill ratios for the electrical contact material as the size of interconnect lines continues to shrink. Accordingly, a need still exists in this art for a process for forming electrical interconnect lines which does not have the drawbacks of prior processes.

SUMMARY OF THE INVENTION

The present invention meets that need by providing a process for the formation of electrical interconnect lines by a selective metal etch to form electrical interconnections between different layers in a semiconductor device. The process of the present invention has several advantages including the elimination of the need to form a via by etching through an oxide layer, resulting in a construction which provides superior electrical contacts between electrically conductive features on different layers of the semiconductor device. Additionally, the process of the present invention produces self-aligned vias, thereby eliminating misalignment problems and the need to pattern surrounds onto the M1 layer or any other lower level metal.

In accordance with one aspect of the present invention, a process is provided for forming electrical interconnect lines between electrical features located in different layers in a semiconductor device, which process includes providing a semiconductor substrate which includes a first electrically conductive feature, removing at least a portion of the first electrically conductive feature to form at least one via therein, depositing an electrically conductive material into the at least one via to form an electrically conductive interconnect plug, partially removing the first electrically conductive feature adjacent the interconnect plug to expose at least a portion of the interconnect plug, depositing a layer of dielectric material over the interconnect plug, partially removing the layer of dielectric material to expose at least a portion of the interconnect plug, and positioning a second electrically conductive feature in electrical contact with the interconnect plug to provide an electrical connection between the first and second electrically conductive features in the semiconductor device.

In one embodiment of the process, the step of forming the at least one via includes depositing a first photoresist layer on an upper surface of the first electrically conductive feature and patterning the first photoresist layer with a via pattern, etching the patterned area to at least partially remove a portion of the first electrically conductive feature and to form the at least one via, and removing the remainder of the first photoresist layer from the upper surface of the first electrically conductive feature.

In another embodiment, the step of partially removing the first electrically conductive feature adjacent the interconnect plug to expose at least a portion of the interconnect plug includes depositing a second photoresist layer onto the surface of the first electrically conductive feature and the interconnect plug and patterning the second photoresist layer to form at least one opening in the first electrically conductive feature, etching through the first electrically conductive feature to the semiconductor substrate to form the at least one via adjacent the interconnect plug, removing the remainder of the second photoresist layer, and partially etching the first electrically conductive feature adjacent the interconnect plug.

Preferably, the electrically conductive material forming the electrical interconnect plug is selected from the group consisting of aluminum, copper, tungsten, gold, silver, and alloys thereof, although other conductive materials may be used. The first electrically conductive feature may be an electrically conductive layer comprising a metal selected from the group consisting of aluminum and copper. Typically, the first electrically conductive feature has a thickness of between about 500 to about 14,000 Å.

Preferably, after the metal is deposited to form the electrically conductive interconnect plug, excess metal is removed from the structure using either chemical-mechanical planarization or etch-back techniques. Thus, in one embodiment, the process includes the step of planarizing or etching back the upper surface of the first electrically conductive feature and the interconnect plug.

Preferably, the first electrically conductive feature is etched using a reactive ion etch and the step of partially removing the first electrically conductive feature adjacent the interconnect plug to expose at least a portion of the interconnect plug comprises selectively etching the first electrically conductive feature. However, other etching techniques may be used. However, using the process of the present invention, there is no need for any etch through an oxide layer.

Accordingly, it is a feature of the present invention to provide a process for the formation of electrical interconnect lines by a selective metal etch to form electrical interconnections between different layers in a semiconductor device. It is another feature of the invention to eliminate the need to form any vias or contact openings by etching through an oxide layer. This results in a construction which provides superior electrical contacts between electrically conductive features on different layers of the semiconductor device. This, and other features and advantages of the present invention, will become apparent from the following detailed description, the accompanying drawings, and the appended claims.

BRIEF DESCRIPTION OF THE DRAWINGS

In order to aid in a better understanding of the invention, reference will now be made, by way of example, to the accompanying drawings in which.

DETAILED DESCRIPTION OF THE PREFERRED EMBODIMENTS

The present invention provides a process for the formation of electrical interconnect lines by a selective metal etch to form electrical interconnections between different layers in a semiconductor device. The process eliminates the need to form any vias or contact openings by etching through an oxide layer. Further, the process produces self-aligned contacts between layers in a semiconductor device. As used herein, the term "via" or "contact" refers to vias, trenches, grooves, contact holes, and the like in a substrate. The process results in a construction which provides superior electrical contacts between electrically conductive features on different layers of the semiconductor device.

Referring now to FIGS. 2–11, a first embodiment of the process of the present invention is illustrated. As shown, a semiconductor substrate 10 is provided. Substrate 10 may be any silicon-containing structure including silicon wafers, silicon structures in the process of fabrication, a semiconductor layer, including a semiconductor layer in the process of fabrication, and the like. Substrate 10 refers either to the lowest layer of a semiconductor material in a wafer or a wafer having additional layers or structures formed thereon. Typically, substrate 10 may be formed of, for example silicon or an oxide or nitride. Substrate 10 includes at least one electrically conductive feature thereon which, in this embodiment, comprises a first electrically conductive layer 12 which has been deposited onto substrate 10 by conventional techniques such as, for example, chemical vapor deposition (CVD) or physical vapor deposition (PVD). Layer 12 forms an M1 metal layer in the layered stack. In the present invention, the thickness of layer 12 is formed to encompass both the contemplated M1 stack height as well as the via or contact height between metal layers on the semiconductor device.

Layer 12 may be comprised of an electrically conductive material, a metal or an alloy. Examples of suitable materials for layer 12 include metals such as aluminum or copper. Typically, layer 12 will have a thickness of from between about 500 to about 14,000 Å, with approximately 3,000–5,000 Å of the thickness representing the desired via height. However, it will be recognized that these thicknesses may vary depending upon the particular desired structure and dimensions for the semiconductor device. For example, where layer 12 comprises aluminum, the aluminum may be deposited using a PVD process involving sputtering in an inert gas such as argon or nitrogen at a temperature in the range of from about 0 to about 500° C. and at a pressure of from between about 0.1 to about 20 mTorr.

Figure 1A:
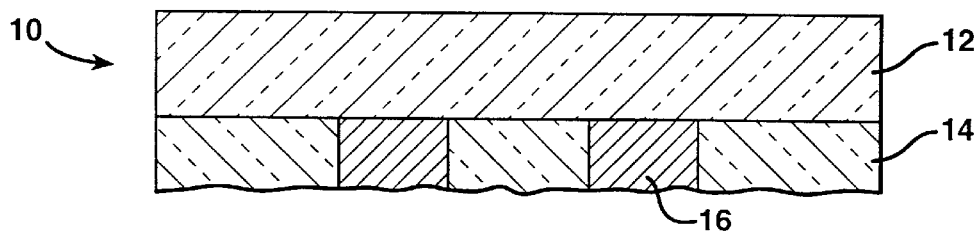
FIGS. 1a–1d are cross-sectional views of a prior art process for the formation of a multilayer electrical interconnect.
Figure 1B:
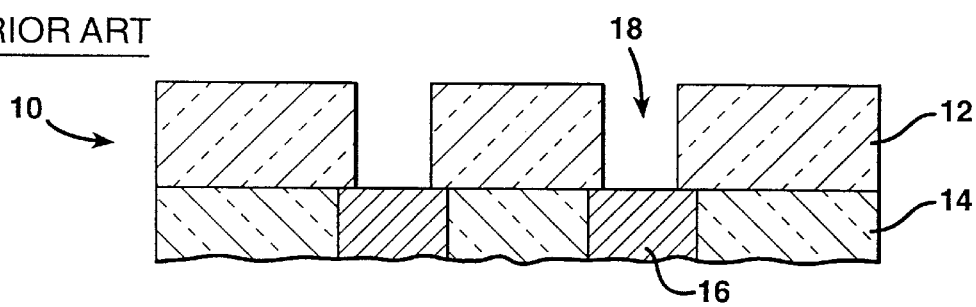
Figure 1C:
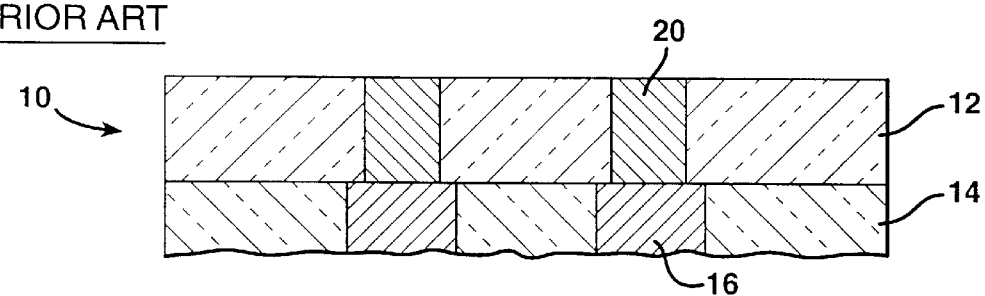
Figure 1D:
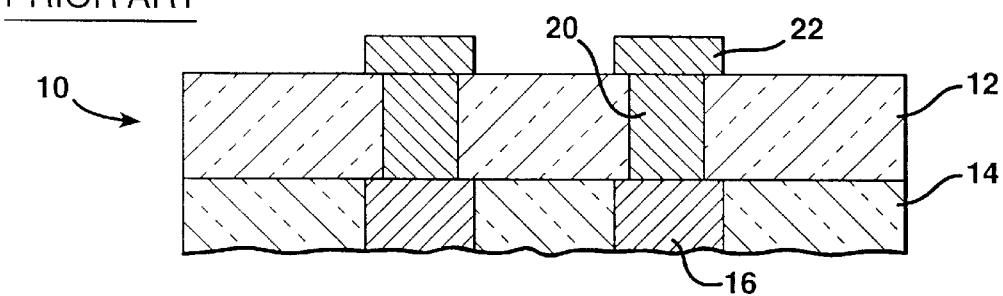
Figure 2:
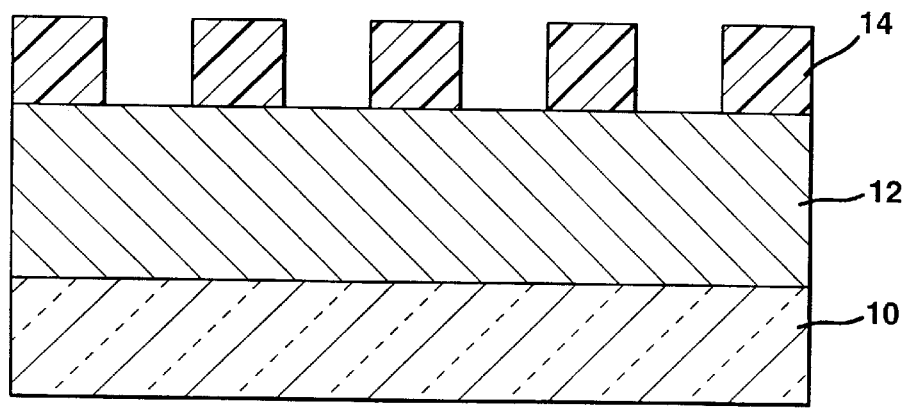
FIG. 2 is a cross-sectional view of a first embodiment of the invention in which a semiconductor substrate having a first metal layer thereon is provided and then patterned with a photoresist.
Figure 3:
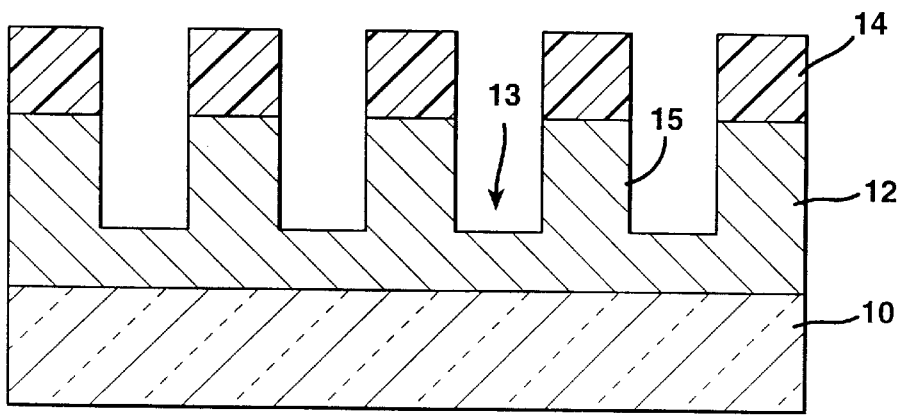
FIG. 3 is a cross-sectional view of the step of etching vias into the first metal layer.

Also shown in FIG. 2 is a layer 14 of a mask material such as a photoresist which has been patterned in a conventional manner using photolithography techniques to expose the desired via pattern on underlying layer 12. Referring now to FIG. 3, a partial etch has been carried out on layer 12 to form at least one (four are illustrated) via 13 having a desired height. Preferably, the etch through electrically conductive layer 12 utilizes a reactive ion etching technique which produces anisotropic etching of layer 12 to form substantially vertical walls 15 in the via 13. For example, if layer 12 comprises aluminum, then the etch may be carried out using, for example, chlorine, boron trichloride, or a combination of nitrogen and carbon tetrafluoride gas. The etch may be carried out at a pressure of from between about 1 to about 60 mTorr and at a temperature of between about 0 to about 100° C. The gas is ionized using a power source, and the gas plasma ions are directed toward the surface of layer 12. After etching is completed, the patterned photoresist mask is then removed.

Figure 4:
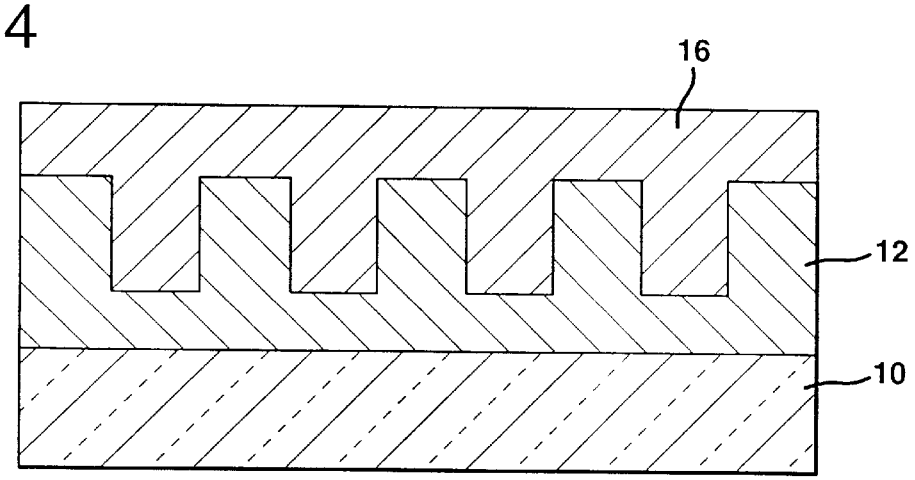
FIG. 4 is a cross-sectional view of the step of depositing a second metal into the vias in the first metal layer to form an interconnect plug.
Figure 5:
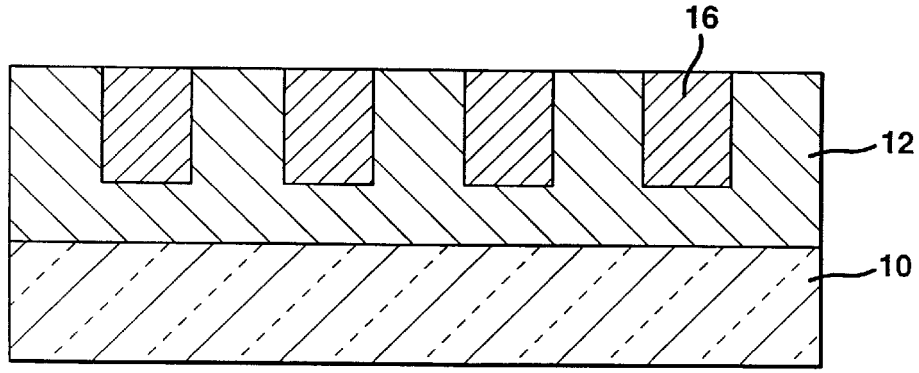
FIG. 5 is a cross-sectional view of FIG. 4 after the upper surface of the semiconductor device has been planarized.

After photoresist removal, an electrically conductive material is deposited in the at least one via 13 to fill that via as shown in FIG. 4. The electrically conductive material may be selected from the group consisting of aluminum, copper, tungsten, gold, silver, and alloys thereof. Depending on the particular metal or alloy selected, it may be desirable to deposit a barrier or wetting layer (not shown) into via 13 prior to depositing the metal to fill the via. Conventional deposition techniques may be used to fill via 13 including sputter deposition, physical vapor deposition (PVD), and chemical vapor deposition (CVD) techniques. For example, if the metal to be deposited is tungsten, the tungsten may be sputter deposited to a thickness of up to about 5000 Å. Alternatively, the tungsten may be deposited using CVD techniques using a tungsten hexafluoride/hydrogen gas. Once via 13 has been filled, as shown in FIG. 5, excess material is removed from the structure, typically by using chemical-mechanical polishing (CMP) or dry etch-back techniques to planarize the surface of the device. The resulting structure includes at least one metal interconnect plug 16 in electrical contact with conductive layer 12.

Figure 6:
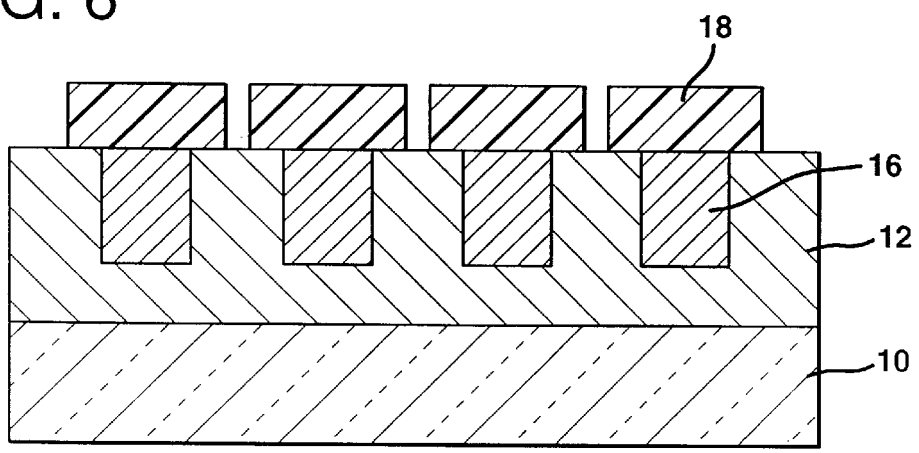
FIG. 6 is a cross-sectional view of a patterned photoresist extending around the interconnect plugs.
Figure 7:
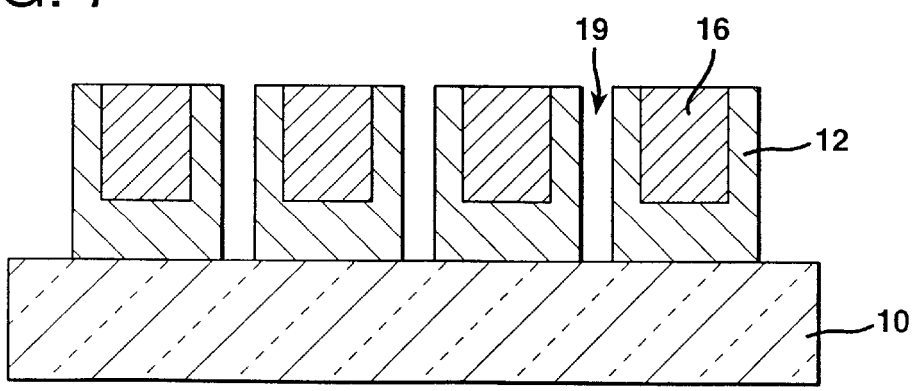
FIG. 7 is a cross-sectional view after etching of the device of FIG. 6.

Referring now to FIGS. 6 and 7, additional masking material such a photoresist material 18 is deposited and patterned as shown. The photoresist pattern is preferably designed to extend beyond the edges of electrical interconnect plug 16. The exposed portions of layer 12 are then etched back to substrate 10 using, for example, reactive ion etching, to produce the structure of FIG. 7 in which the electrical interconnect plugs 16 are carried within pillars of electrically conductive layer 12 which has now been divided into separate electrically conductive features in the M1 layer of the semiconductor structure.

Figure 8:
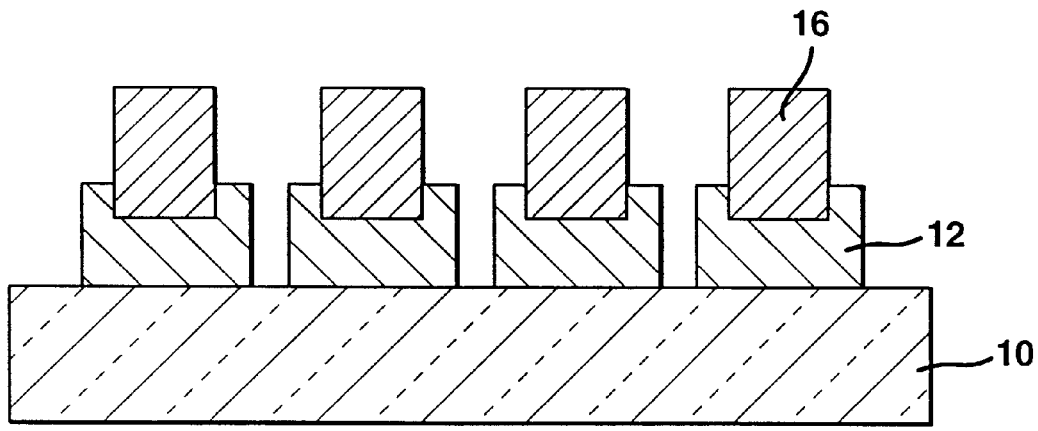
FIG. 8 is a cross-sectional view after the first metal has been partially etched back from the electrical interconnect plugs.
Figure 9:
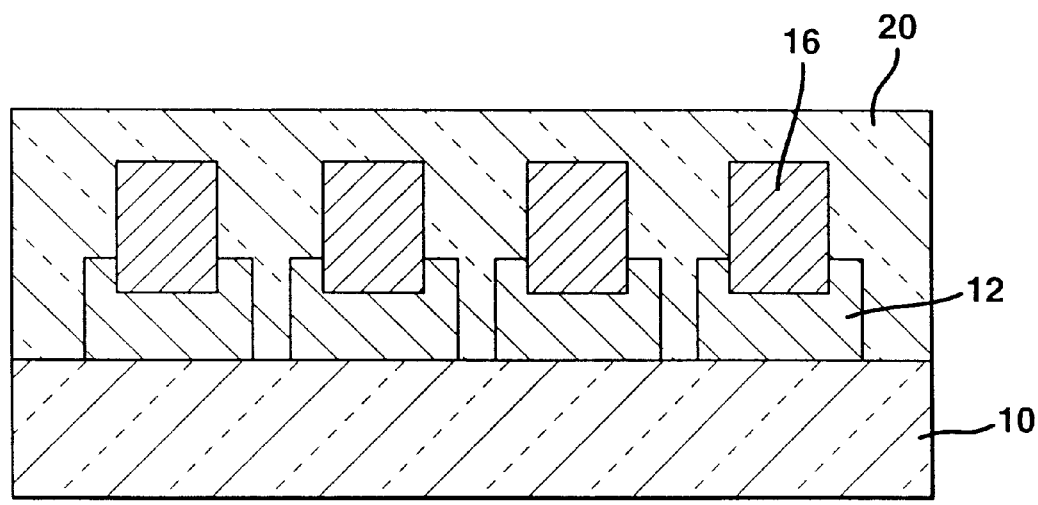
FIG. 9 is a cross-sectional view of the device of FIG. 8 after the step of depositing an interlayer dielectric over the electrical interconnect plugs and first metal.
Figure 10:
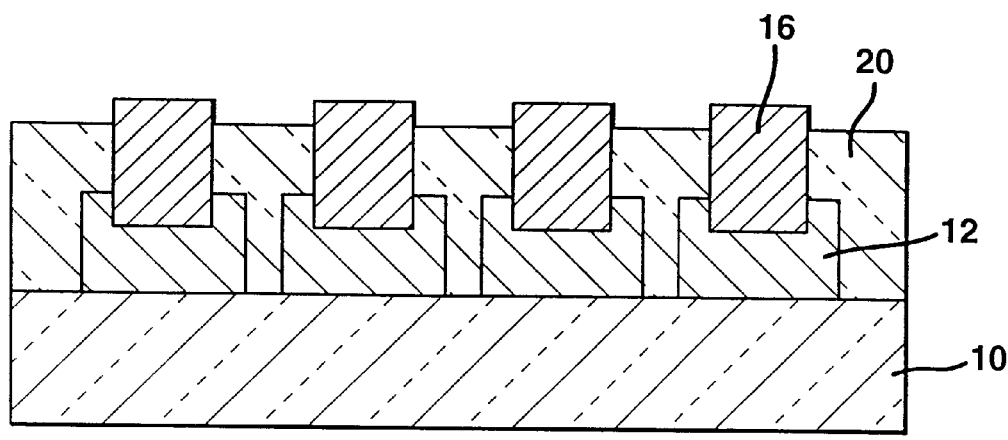
FIG. 10 is a cross-sectional view of the device of FIG. 9 after a portion of the interlayer dielectric has been removed to expose the electrical interconnect plugs.

A second selective etch is then performed as shown in FIG. 8 to remove at least a portion of layer 12 around electrical interconnect plugs 16 to expose those plugs. For example, if layer 12 comprises copper or aluminum and plugs 16 comprise tungsten, the use of a chlorine-cased etchant gas will selectively etch the layer 12 material. This etch is then followed by the deposition of a layer 20 of a dielectric material. Layer 20 may be of any dielectric material including oxides, nitrides, and oxynitrides as well as low K materials. Typically, layer 20 will be comprised of silicon oxide or a spin-on-glass (SOG) composition. As shown in FIG. 10, layer 20 is then planarized to expose at least a portion of interconnect plugs 16. Because layer 20 is softer and easier to remove, standard CMP techniques will result in the partial exposure of plugs 16 as shown. Alternatively, a partial etch of layer 20 will achieve the same result.

Figure 11:
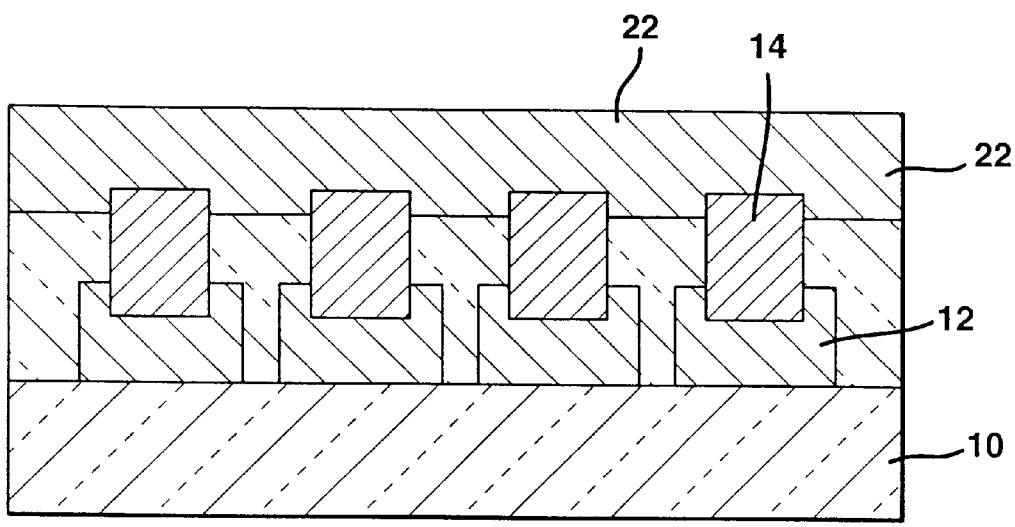
FIG. 11 is a cross-sectional view of the device of FIG. 10 after the step of depositing a second metal layer onto the semiconductor device.
Figure 12:
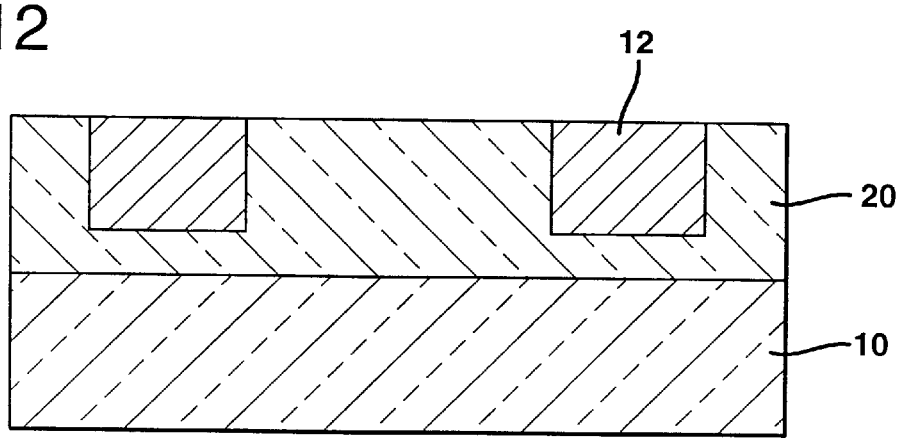
FIG. 12 is a cross-sectional view of another embodiment of the invention in which a semiconductor device having an oxide layer thereon with electrically conductive features in the oxide layer is provided.

The second metal layer 22 (M2) is then deposited onto the structure as shown in FIG. 11 to produce electrical interconnects 16 between the electrically conductive features 12 on the M1 layer with the M2 layer. The M2 layer may then be patterned and etched as is conventional to form discrete electrical connections between M1 and M2 layers. As shown and described, the process of the present invention is accomplished without conducting any etches through oxide dielectric layers, thereby avoiding the problems discussed above. Rather, the electrical interconnects are formed first, and the dielectric layer is deposited around existing interconnect plugs. This process results in a semiconductor device having superior electrical contacts between the M1 and M2 layers in a semiconductor stack. Further, as the process produces contacts which are self-aligned, superior electrical connections between layers of the device result.

Referring now to FIGS. 12–20, where like reference numerals refer to like elements, another embodiment of the process of the present invention is illustrated. As shown, a semiconductor substrate 10 is provided having a dielectric layer 20 thereon which contains at least one electrically conductive feature 12. The thickness of feature 12 desirably encompasses both the desired M1 layer height as well as the desired via height for the electrical interconnect between M1 and M2 layers. Generally, and again depending upon the final desired dimensions and features of the semiconductor device, the thickness of feature 12 will be from about 500 to about 15,000 Å. Layer 12 may be comprised of the same electrically conductive materials as previously discussed.

Figure 13:
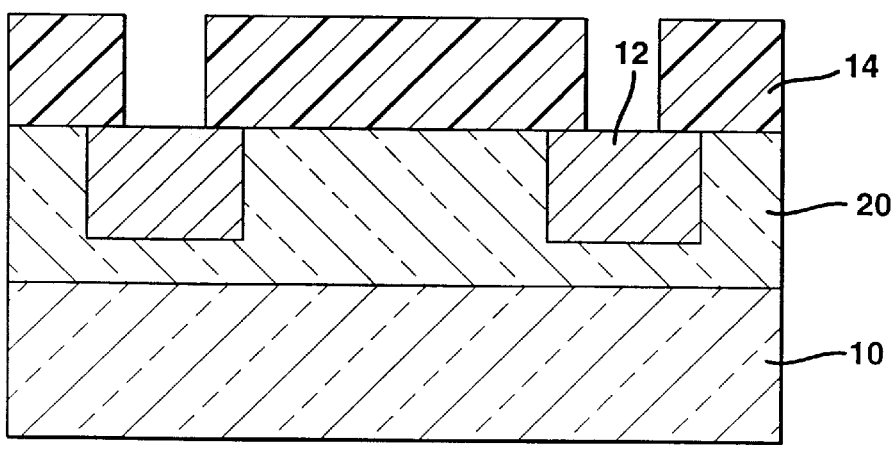
FIG. 13 is a cross-sectional view of the device of FIG. 12 with a patterned photoresist layer thereon.
Figure 14:
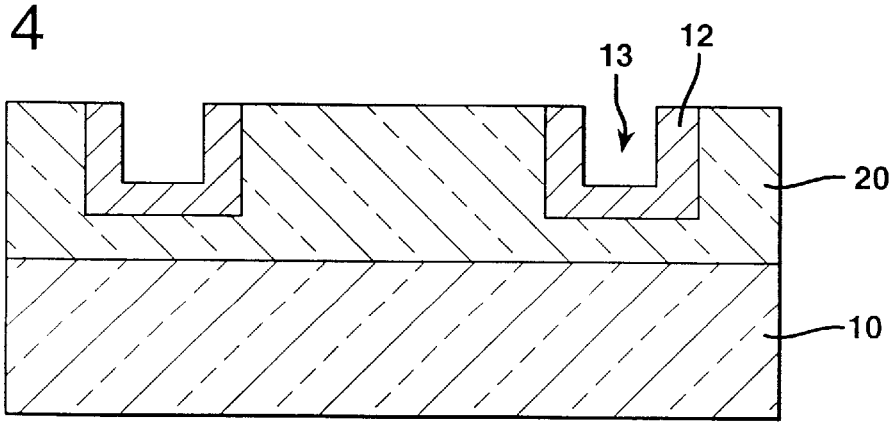
FIG. 14 is a cross sectional view of the semiconductor device after vias have been partially etched into the electrically conductive features.

As shown in FIG. 13, a layer 14 of a mask material such as a photoresist is applied and patterned in a conventional manner to expose a via pattern over each of electrical features 12. Feature 12 is then etched as shown in FIG. 14, preferably by an anisotropic etch process such as a reactive ion etch, to form vias 13 in electrically conductive features 12. The photoresist material is then removed.

Figure 15:
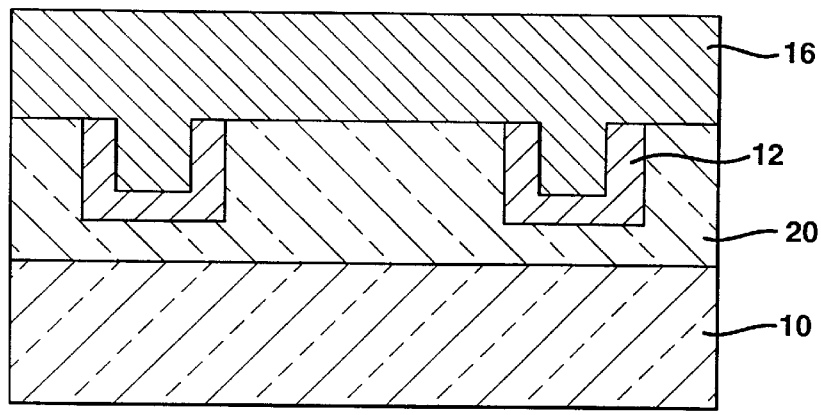
FIG. 15 is a cross sectional view of the semiconductor device after deposition of electrically conductive interconnect material into the vias.
Figure 16:
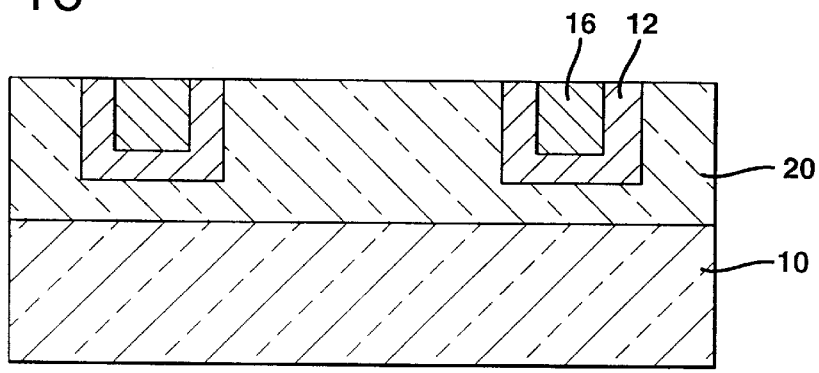
FIG. 16 is a cross sectional view of the semiconductor device of FIG. 15 after its surface has been planarized.

After photoresist removal, an electrically conductive material 16 is deposited in the vias 13 to fill those vias as shown in FIG. 15. The electrically conductive material may be selected from the group consisting of aluminum, copper, tungsten, gold, silver, and alloys thereof. Depending on the particular metal or alloy selected, it may be desirable to deposit a barrier or wetting layer (not shown) into via 13 prior to depositing the metal to fill the via. Conventional deposition techniques may be used to fill via 13 including sputter deposition, physical vapor deposition (PVD), and chemical vapor deposition (CVD) techniques. For example, if the metal to be deposited is tungsten, the tungsten may be sputter deposited to a thickness of up to about 5000 Å. Alternatively, the tungsten may be deposited using CVD techniques using a tungsten hexafluoride/hydrogen gas. Once via 13 has been filled, as shown in FIG. 15, excess material is removed from the structure, typically by using chemical-mechanical polishing (CMP) or etch back techniques to planarize the surface of the device. The resulting structure is shown in FIG. 16 and includes at least one metal interconnect plug 16 in electrical contact with conductive feature 12.

Figure 17:
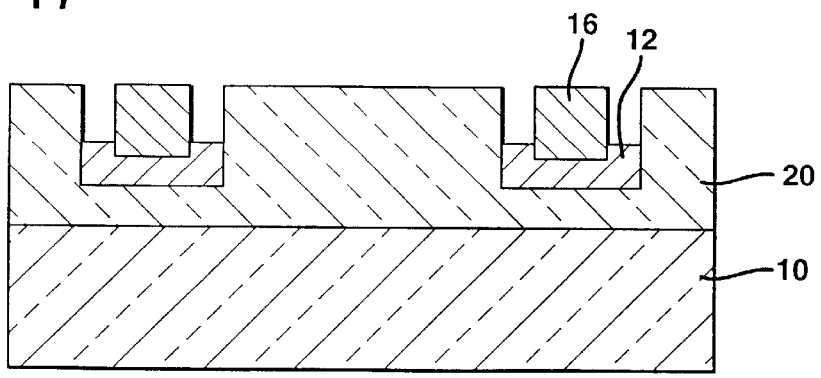
FIG. 17 is a cross sectional view of the semiconductor device in which the electrically conductive features have been partially etched to expose the interconnects.

Plugs 16 are exposed by a partial selective etch performed on the device as is shown in FIG. 17. As described above, where the layer 12 material is aluminum, and the electrical interconnect material is tungsten, selective etching of the aluminum can be carried out suing chlorine-based etchant gases. Of course, it is within the skill of the art to provide for other material combinations for materials 12 and 16 which would provide for the desired selective etch. The exposed portions of layer 12 may be partially etched back, for example, using reactive ion etching, to produce the structure of FIG. 17 in which the electrical interconnect plugs 16 form pillars arising out of electrically conductive features 12.

Figure 18:
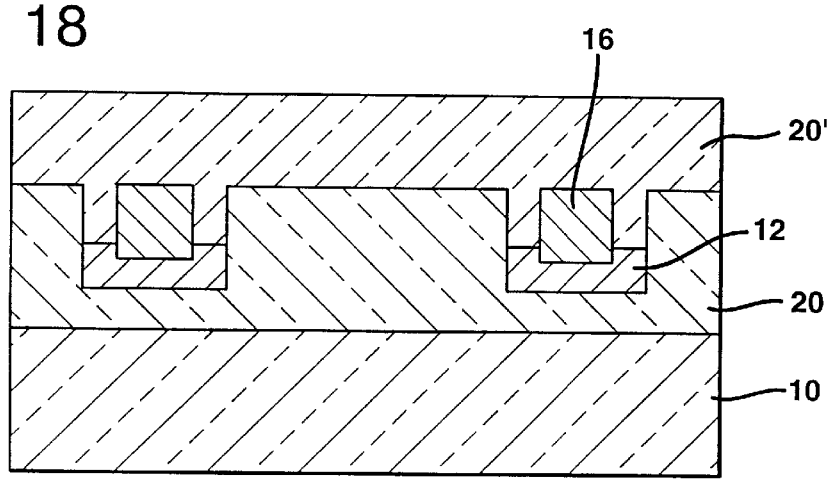
FIG. 18 is a cross sectional view of the semiconductor device after an interlayer dielectric has been deposited.
Figure 19:
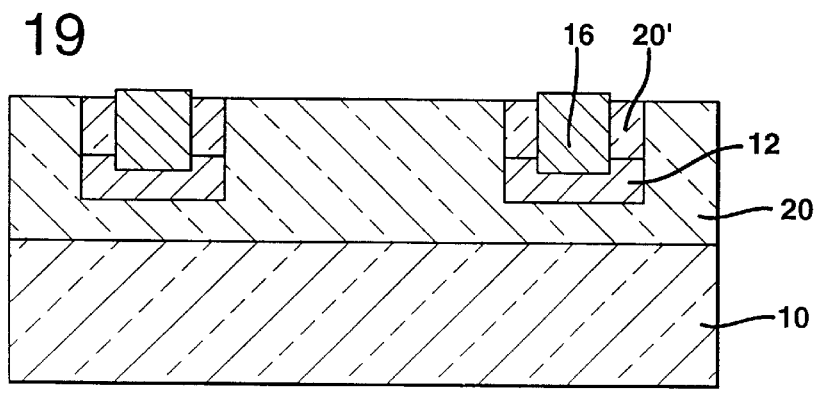
FIG. 19 is a cross sectional view of the semiconductor device of FIG. 18 after planarization to expose the interconnects again.

A second layer of dielectric material 20', which may be the same as or different in composition as dielectric layer 20, is then deposited onto the surface of the semiconductor device, covering electrical interconnect plugs 16 as shown in FIG. 18. As shown in FIG. 19, layer 20 is then planarized to expose at least a portion of interconnect plugs 16. Because layers 20 and 20' are softer and easier to remove, standard CMP techniques will result in the partial exposure of plugs 16 as shown. Alternatively, a partial etch of layers 20 and 20' will achieve the same result.

Figure 20:
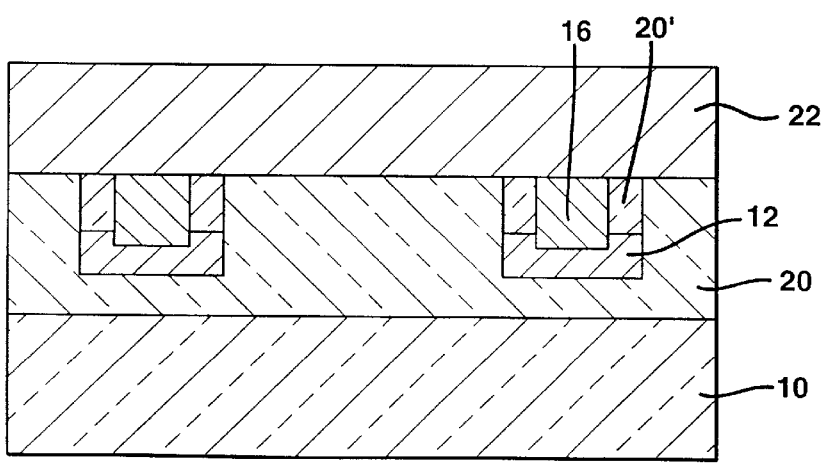
FIG. 20 is a cross sectional view of the semiconductor device FIG. 19 after the step of depositing a second metal layer onto the semiconductor device.

The second metal layer 22 (M2) is then deposited onto the structure as shown in FIG. 20 to produce electrical interconnects 16 between the electrically conductive features 12 on the M1 layer with the M2 layer. The M2 layer may then be patterned and etched as is conventional to form discrete electrical connections between M1 and M2 layers.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A process for forming electrical interconnect lines between electrical features located in different layers in a semiconductor device comprising:

provifing a semiconductor substrate which includes a first electrically conductive feature;

removing at least a portion of said first electrically conductive feature to form at least one via therein;

depositing a metal into said at least one via to form an electrically conductive interconnect plug;

partially removing said first electrically conductive feature adjacent said interconnect plug to expose at least a portion of said interconnect plug;

depositing a layer of dielectric material over said interconnect plug;

partially removing said layer of dielectric material to expose at least a portion of said interconnect plug; and positioning a second electrically conductive feature in electrical contact with said interconnect plug to provide an electrical connection between said first and second electrically conductive features in said semiconductor device.

2. A process as claimed in claim 1 in which the step of forming said at least one via comprises depositing a first photoresist layer on an upper surface of said first electrically conductive feature and patterning said first photoresist layer with a via pattern; etching the patterned area to at least partially remove a portion of said first electrically conductive feature and to form said at least one via; and removing the remainder of said first photoresist layer from said upper surface of said first electrically conductive feature.

3. A process as claimed in claim 1 in which the step of partially removing said first electrically conductive feature adjacent said interconnect plug to expose at least a portion of said interconnect plug comprises depositing a second photoresist layer onto the surface of said first electrically conductive feature and said interconnect plug and patterning said second photoresist layer to form at least one opening in said first electrically conductive feature; etching through said first electrically conductive feature to said semiconductor substrate to form said at least one via adjacent said interconnect plug; removing the remainder of said second photoresist layer; and partially selectively etching said first electrically conductive feature adjacent said interconnect plug.

4. A process as claimed in claim 1 in which said electrical interconnect plug is selected from the group consisting of aluminum, copper, tungsten, gold, silver, and alloys thereof.

5. A process as claimed in claim 1 in which said first electrically conductive feature is an electrically conductive layer comprising a metal selected from the group consisting of aluminum and copper.

6. A process as claimed in claim 5 in which said first electrically conductive feature has a thickness of between about 500 to about 14,000 Å.

7. A process as claimed in claim 1 including planarizing said upper surface of said first electrically conductive feature and said interconnect plug.

8. A process as claimed in claim 1 including etching back said upper surface of said first electrically conductive feature and said interconnect plug.

9. A process as claimed in claim 2 in which said first electrically conductive feature is etched using a reactive ion etch.

10. A process as claimed in claim 3 in which said first electrically conductive feature is etched using a reactive ion etch.

11. A process as claimed in claim 1 in which the step of partially removing said first electrically conductive feature adjacent said interconnect plug to expose at least a portion of said interconnect plug comprises selectively etching said first electrically conductive feature.

12. A process for forming electrical interconnect lines in a semiconductor device comprising:
   providing a semiconductor substrate which includes a first electrically conductive layer;
   depositing a first photoresist layer on an upper surface of said first electrically conductive layer and patterning said first photoresist layer with a via pattern;
   etching the patterned area to at least partially remove a portion of said first electrically conductive layer and to form at least one via;
   removing the remainder of said first photoresist layer from said upper surface of said first electrically conductive layer;
   depositing a metal into said at least one via to form an electrically conductive interconnect plug;
   planarizing said upper surface of said first electrically conductive layer and said interconnect plug;
   depositing a second photoresist layer onto said planarized surface of said first electrically conductive layer and said interconnect plug and patterning said second photoresist layer with a metal line pattern to form at least one opening;
   etching through said first electrically conductive layer to said semiconductor substrate to form at least one via adjacent said interconnect plug;
   removing the remainder of said second photoresist layer;
   partially removing said first electrically conductive layer adjacent said interconnect plug to expose at least a portion of said interconnect plug;
   depositing a layer of dielectric material over said interconnect plug and extending into said at least one via;
   partially removing said layer of dielectric material to expose at least a portion of said interconnect plug; and
   positioning a second electrically conductive layer in electrical contact with said interconnect plug to provide an electrical connection between said first and second electrically conductive layers in said semiconductor device.

13. A process as claimed in claim 12 in which said electrical interconnect plug is selected from the group consisting of aluminum, copper, tungsten, gold, silver, and alloys thereof.

14. A process as claimed in claim 12 in which said first electrically conductive layer comprises a metal selected from the group consisting of aluminum and copper.

15. A process as claimed in claim 14 in which said first electrically conductive layer has a thickness of between about 500 to about 14,000 Å.

16. A process as claimed in claim 13 in which said step of etching through said first electrically conductive layer to said semiconductor substrate forms at least two separate electrically conductive features on said semiconductor substrate.

17. A process as claimed in claim 13 in which said second photoresist layer is patterned to form openings larger than said interconnect plug.

18. A process as claimed in claim 14 in which said first electrically conductive layer is etched using a reactive ion etch.

19. A process for forming electrical interconnect lines in a semiconductor device comprising:
   providing a semiconductor substrate which includes a first electrically conductive feature;
   depositing a first photoresist layer on an upper surface of said first electrically conductive feature and patterning said first photoresist layer with a via pattern;
   etching the patterned area to at least partially remove a portion of said first electrically conductive feature and to form at least one via;
   removing the remainder of said first photoresist layer from said upper surface of said first electrically conductive feature;
   depositing a metal into said at least one via to form an electrically conductive interconnect plug;
   planarizing said upper surface of said first electrically conductive feature and said interconnect plug;
   partially removing said first electrically conductive feature adjacent said interconnect plug by selectively etching said first electrically conductive feature to expose at least a portion of said interconnect plug;
   depositing a layer of dielectric material over said interconnect plug and extending into said at least one via;
   partially removing said layer of dielectric material to expose at least a portion of said interconnect plug; and
   positioning a second electrically conductive feature in electrical contact with said interconnect plug to provide an electrical connection between said first and second electrically conductive features in said semiconductor device.

20. A process as claimed in claim 19 in which said electrical interconnect plug is selected from the group consisting of aluminum, copper, tungsten, gold, silver, and alloys thereof.

21. A process as claimed in claim 19 in which said first electrically conductive feature comprises a layer of metal selected from the group consisting of aluminum and copper.

22. A process as claimed in claim 21 in which said first electrically conductive feature has a thickness of between about 500 to about 14,000 Å.

23. A process as claimed in claim 21 in which said first electrically conductive feature is etched using a reactive ion etch.

* * * * *